(12) United States Patent
Gong et al.

(10) Patent No.: US 12,191,324 B2
(45) Date of Patent: Jan. 7, 2025

(54) ARRAY SUBSTRATE, MANUFACTURING METHOD OF ARRAY SUBSTRATE, AND DISPLAY PANEL

(71) Applicant: WUHAN CHINA STAR OPTOELECTRONICS TECHNOLOGY CO., LTD., Wuhan (CN)

(72) Inventors: Fan Gong, Wuhan (CN); Fei Ai, Wuhan (CN); Jiyue Song, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 595 days.

(21) Appl. No.: 17/593,659

(22) PCT Filed: Jul. 26, 2021

(86) PCT No.: PCT/CN2021/108358
§ 371 (c)(1),
(2) Date: Sep. 22, 2021

(87) PCT Pub. No.: WO2022/267159
PCT Pub. Date: Dec. 29, 2022

(65) Prior Publication Data
US 2023/0215881 A1 Jul. 6, 2023

(30) Foreign Application Priority Data
Jun. 24, 2021 (CN) .......................... 202110702781.9

(51) Int. Cl.
H01L 27/144 (2006.01)
H01L 27/12 (2006.01)

(52) U.S. Cl.
CPC ...... H01L 27/1446 (2013.01); H01L 27/1288 (2013.01)

(58) Field of Classification Search
CPC ............. H01L 27/1446; H01L 27/1288; H01L 27/1255; H01L 27/146; H01L 27/14609; H01L 27/14692; G09F 9/30; H10K 59/13
See application file for complete search history.

(56) References Cited

U.S. PATENT DOCUMENTS

2012/0092302 A1* 4/2012 Imai .................... G02F 1/13318
345/175
2016/0013242 A1* 1/2016 Yang ................. H01L 27/14658
257/292

(Continued)

FOREIGN PATENT DOCUMENTS

CN 103972249 A 8/2014
CN 105913021 A 8/2016

(Continued)

Primary Examiner — Jami Valentine Miller
Assistant Examiner — Nicholas B Michaud
(74) Attorney, Agent, or Firm — The Roy Gross Law Firm, LLC; Roy Gross

(57) ABSTRACT

An array substrate, a manufacturing method of the array substrate, and a display panel are provided. The array substrate includes a photosensitive sensor. The photosensitive sensor includes a photosensitive module and a storage module. The photosensitive module includes a photosensitive semiconductor layer. The storage module includes a first electrode plate and a second electrode plate. Wherein, the photosensitive semiconductor layer is disposed on an extension section of a drain electrode. A number of film layer of the photosensitive sensor is decreased, and photomasks are saved.

20 Claims, 7 Drawing Sheets

(56) References Cited

U.S. PATENT DOCUMENTS

| | | | | |
|---|---|---|---|---|
| 2018/0053032 A1* | 2/2018 | Ding | .................. | G06V 40/1318 |
| 2019/0006441 A1* | 1/2019 | Ling | .................. | H10K 59/1213 |
| 2020/0058680 A1 | 2/2020 | Liu | | |
| 2020/0212137 A1 | 7/2020 | Wang et al. | | |
| 2020/0321408 A1* | 10/2020 | Wang | ................ | H01L 31/02161 |
| 2021/0202600 A1* | 7/2021 | Wang | .................. | H10K 59/353 |

FOREIGN PATENT DOCUMENTS

| | | |
|---|---|---|
| CN | 106229331 A | 12/2016 |
| CN | 107415038 A | 12/2017 |
| CN | 108878503 A | 11/2018 |
| CN | 109727968 A | 5/2019 |
| CN | 109728050 A | 5/2019 |
| CN | 109742113 A | 5/2019 |
| CN | 111584673 A | 8/2020 |
| JP | 2006114596 A | 4/2006 |

\* cited by examiner

ARRAY SUBSTRATE, MANUFACTURING METHOD OF ARRAY SUBSTRATE, AND DISPLAY PANEL

This application is a National Phase of PCT Patent Application No. PCT/CN2021/108358 having International filing date of Jul. 26, 2021, which claims the benefit of priority Chinese Patent Application No. 202110702781.9, filed Jun. 24, 2021, the contents of which are all incorporated herein by reference in their entirety.

BACKGROUND OF INVENTION

Field of Invention

The present application relates to a field of display, and specifically to an array substrate, a manufacturing method of the array substrate, and a display panel.

Description of Prior Art

With rapid development of panel industry, in addition to requirements of high resolution, wide viewing angles, and low power consumption of displays, etc., people also have other requirements for display panels. Enriching panel functions, increasing human-computer interaction, and improving competitiveness of the display panels are currently one of main development directions of the display panels. By integrating environmental light photosensitive sensors into display panels, punching holes on screens can be omitted or screen sizes can be reduced. Therefore, affecting aesthetics and screen-to-body ratios of the screens are prevented. However, there are problems of many layers of current environmental light photosensitive sensors integrated in the display panels and complicated processes.

SUMMARY OF INVENTION

Embodiments of the present application provide an array substrate, a manufacturing method of the array substrate, and a display panel, which solves problems of many layers of current environmental light photosensitive sensors integrated in the display panels and complicated processes.

One embodiment of the present application provides an array substrate, including
- a substrate;
- a thin film transistor disposed on the substrate and including a gate electrode, an active layer, a source electrode, and a drain electrode;
- a photosensitive sensor wherein the photosensitive sensor includes a photosensitive module and a storage module, the photosensitive module includes a photosensitive semiconductor layer, and the storage module includes a first electrode plate and a second electrode plate, and
- wherein the photosensitive semiconductor layer is disposed on an extension section of the drain electrode, the first electrode plate is electrically connected to a side of the photosensitive semiconductor layer away from the extension section of the drain electrode, and the second electrode plate is electrically connected to the drain electrode.

Correspondingly, one embodiment of the present application further provides a manufacturing method of the array substrate, including following manufacturing steps:
- step S100: providing a base substrate, and manufacturing a thin film transistor on the base substrate, wherein the thin film transistor includes a gate electrode, an active layer, a source electrode and a drain electrode connected to the active layer;
- step S200: forming a photosensitive semiconductor layer on an extension section of the drain electrode;
- step S300: forming a first insulation layer on the photosensitive semiconductor layer, and forming a first metal layer with a patterned shape on the first insulation layer, wherein the first metal layer includes one of a first electrode plate or a second electrode plate;
- step S400: forming a second insulation layer on the first metal layer, and forming a second metal layer with a patterned shape on the second insulation layer, wherein the second metal layer includes another one of the first electrode plate or the second electrode plate, the first electrode plate is electrically connected to the photosensitive semiconductor layer through a via hole, the second electrode plate is electrically connected to the drain electrode through other via hole, and the first electrode plate and the second electrode plate compose a storage capacitor.

Correspondingly, one embodiment of the present application further provides a display, including an array substrate. Wherein, the array substrate includes:
- a substrate;
- a thin film transistor disposed on the substrate and comprising a gate electrode, an active layer, and a source electrode and a drain electrode connected to the active layer; and
- a photosensitive sensor wherein the photosensitive sensor includes a photosensitive module and a storage module, the photosensitive module includes a photosensitive semiconductor layer, and the storage module includes a first electrode plate and a second electrode plate, and
- wherein the photosensitive semiconductor layer is disposed on an extension section of the drain electrode, the first electrode plate is electrically connected to a side of the photosensitive semiconductor layer away from the extension section of the drain electrode, and the second electrode plate is electrically connected to the drain electrode.

In the embodiments of the present application, the array substrate, the manufacturing method of the array substrate, and the display panel are provided. The photosensitive semiconductor layer is disposed on the extension section of the drain electrode, and the electrode on one side of the photosensitive semiconductor is in a same layer as the drain electrode, which reduce a number of layers of the photosensitive sensor and can reduce a number of manufacturing processes of the array substrate.

DESCRIPTION OF DRAWINGS

To more clearly illustrate embodiments or the technical solutions of the present application, the accompanying figures of the present application required for illustrating embodiments or the technical solutions of the present application will be described in brief. Obviously, the accompanying figures described below are only part of the embodiments of the present application, from which figures those skilled in the art can derive further figures without making any inventive efforts.

DETAILED DESCRIPTION OF EMBODIMENTS

Figure 1:
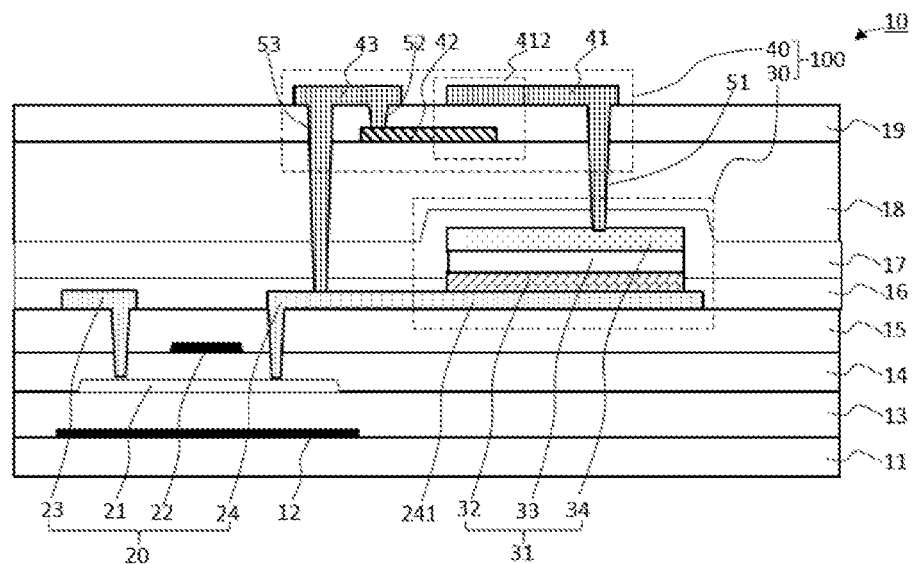
FIG. 1 is a first structural schematic diagram of an array substrate provided by one embodiment of the present application.

The technical solutions in the embodiments of the present application are clearly and completely described in the following with reference to the accompanying drawings in the embodiments of the present application. Obviously, the described embodiments are only part of the embodiments of the present application, but are not all embodiments of the present application. All other embodiments obtained by those skilled in the art based on the embodiments of the present application without creative efforts are within the scope of the present application. Besides, it should be understood that the specific embodiments described herein are merely for describing and explaining the present application and are not intended to limit the present application. In the present application, unless opposite stated, the orientation words used such as "upper" and "lower" generally refer to the upper and lower directions of the device in actual using or working state, and specifically refer to the drawing directions in the drawings, and "inner" and "outer" refer to the outline of the device.

One embodiment of the present application provides an array substrate, including a substrate, a thin film transistor disposed on the substrate and including a gate electrode, an active layer, and a source electrode and a drain electrode connected to the active layer, and a photosensitive sensor, wherein the photosensitive sensor includes a photosensitive module and a storage module, the photosensitive module includes a photosensitive semiconductor layer, and the storage module includes a first electrode plate and a second electrode plate. Wherein, the photosensitive semiconductor layer is disposed on an extension section of the drain electrode, the first electrode plate is electrically connected to a side of the photosensitive semiconductor layer away from the extension section of the drain electrode, and the second electrode plate is electrically connected to the drain electrode.

Embodiments of the present application provide the array substrate, a manufacturing method of the array substrate, and a display panel. Details are described below respectively. It should be noted that a description order of following embodiments is not intended to limit a preferred order of the embodiments.

First Embodiment

Please refer to FIG. 1. FIG. 1 is a schematic diagram of a first type of a structure of an array substrate provided by one embodiment of the present application. The array substrate 10 includes a substrate 11, a thin film transistor 20, and a photosensitive sensor 100. The thin film transistor 20 is disposed on the substrate 11. The thin film transistor 20 includes a gate electrode 22, an active layer 21, a source electrode 23 and a drain electrode 24 connected to the active layer 21. The photosensitive sensor 100 includes a photosensitive module 30 and a storage module 40. The photosensitive module 30 includes a photosensitive semiconductor layer 31. The storage module 40 includes a first electrode plate 41 and a second electrode plate 42. Wherein, the photosensitive semiconductor layer 31 is disposed on an extension section 241 of the drain electrode, the first electrode plate 41 is electrically connected to a side of the photosensitive semiconductor layer 31 away from the extension section 241 of the drain electrode 24, and the second electrode plate 42 is electrically connected to the drain electrode 24.

Furthermore, the storage module 40 includes a storage capacitor 412, and the first electrode plate 41 and the second electrode plate 42 compose the storage capacitor 412.

Specifically, the thin film transistor 20 is disposed on the substrate 11. The thin film transistor 20 includes the gate electrode 22, the active layer 21, the source electrode 23, and the drain electrode 24. The substrate 11 can be a material such as glass, etc. The thin film transistors 20 can be a top-gate type thin film transistor, a bottom-gate type thin film transistor, etc. The type of the thin film transistor 20 is not limited here. A material of the active layer 21 can be polycrystalline silicon, amorphous silicon, a metal oxide semiconductor, etc.

Specifically, the drain electrode 24 has one extension section 241. The photosensitive semiconductor layer 31 is disposed on the extension section 241 of the drain electrode 24. The extension section 241 of the drain electrode 24 acts as an electrode of one side of the photosensitive module 30 or is configured to transmit an electrical signal of the photosensitive semiconductor layer 31. The first electrode plate 41 is electrically connected to a side of the photosensitive semiconductor layer 31 away from the extension section 241 of the drain electrode 24. A part where the first electrode plate 41 is connected to the photosensitive semiconductor layer 31 acts as an electrode of other side of the photosensitive module 30 or is configured to transmit the electrical signal of the photosensitive semiconductor layer 31.

Specifically, the storage module 40 includes the first electrode plate 41 and the second electrode plate 42. The storage module 40 includes the storage capacitor 412. The first electrode plate 41 and the second electrode plate 42 compose the storage capacitor 412, i.e., an insulation layer is disposed between the first electrode plate 41 and the second electrode plate 42, and there is an overlapping part of an orthographic projection of the first electrode plate 41 on the substrate 11 and an orthographic projection of the second electrode plate 42 on the substrate 11, so the storage capacitor 412 is formed.

Specifically, please refer to FIG. 1. The array substrate 10 of the embodiments of the present application includes a light-shielding layer 12 disposed on the substrate, a buffer layer 13 disposed on the light-shielding layer 12, the active layer 21 disposed on the buffer layer 13, a gate insulation layer 14 disposed on the active layer 21, the gate electrode 22 disposed on the gate insulation layer 14, an interlayer insulation layer 15 disposed on the gate electrode 22, the source electrode 23 and the drain electrode 24 disposed on the interlayer insulation layer 15, a protective insulation layer 16 disposed on the source electrode 23 and the drain electrode 24, the photosensitive semiconductor layer 31 disposed on the extension section 241 of the drain electrode 24, a cover insulation layer 17 disposed on the photosensitive semiconductor layer 31, a planarization layer 18 disposed on the cover insulation layer 17, and the second electrode plate 42 disposed on the planarization layer 18, a second insulation layer 19 disposed on the second electrode plate 42, and the first electrode plate 41 disposed on the second insulation layer 19. Wherein, the protective insulation layer 16 has an opening exposing the extension section 241 of the drain electrode 24. The photosensitive semiconductor layer 31 is disposed on the opening of the protective insulation layer 16 and is in contact with the extension section 241 of the drain electrode 24. The array substrate 10 can also not include the protective insulation layer 16. When the array substrate is manufactured, after the source electrode 23 and the drain electrode 24 are manufactured, the photosensitive semiconductor layer 31 is directly manufactured on the extension section 241 of the drain electrode 24. Materials of the protective insulation layer, the cover insulation layer 17, and the second insulation layer 19 can be inorganic insulation materials, which include, for example, one or two of silicon nitride ($SiN_x$) or silica ($SiO_x$). A material of the planarization layer 18 can be an organic material, and it can be an organic transparent photoresist material specifically. Wherein, only one of the cover insulation layer 17 or the planarization layer 18 can be disposed, or both of them can be disposed. An insulation layer between the second electrode plate 42 and the photosensitive semiconductor layer is named as a first insulation layer. Therefore, the cover insulation layer 17 and/or the planarization layer 18 is the first insulation layer.

In some embodiments, the photosensitive semiconductor layer 31 is manufactured by amorphous silicon.

Specifically, the amorphous silicon has a high absorption coefficient in a visible region, and it does not absorb light in an infrared region basically, which perfectly matches human vision. Therefore, using the amorphous silicon to act as the photosensitive layer can perfectly fit an environmental-light photosensitive sensor. After the amorphous silicon absorbed environmental light, photocurrent is generated. The photocurrent is generated between the first electrode plate 41 and the extension section 241 of the drain electrode 24, which makes a conductive channel form in the photosensitive semiconductor layer 31.

In some embodiments, the photosensitive semiconductor layer 31 includes N-type amorphous silicon 32 disposed on the extension section 241 of the drain electrode 24 and intrinsic amorphous silicon 33 disposed on the N-type amorphous silicon 32.

The N-type amorphous silicon 32 is the amorphous silicon doped with a pentavalent element, for example, phosphorus, arsenic, etc. In the intrinsic amorphous silicon 33, no other element is doped. After using the intrinsic amorphous silicon 33 to absorb the environmental light, photoelectrons and electron holes are generated. The N-type amorphous silicon 32 has extra electrons, which can increase a current in the photosensitive semiconductor layer 31, thereby improving sensitivity of the photosensitive sensor 100.

In some embodiments, the photosensitive semiconductor layer 31 includes the N-type amorphous silicon 32 disposed on the extension section 241 of the drain electrode 24, the intrinsic amorphous silicon 33 disposed on the N-type amorphous silicon 32, and P-type amorphous silicon 34 disposed on the intrinsic amorphous silicon 33.

The P-type amorphous silicon 34 is the amorphous silicon doped with a trivalent element, for example, boron, gallium, etc. In the intrinsic amorphous silicon 33, no other element is doped. After using the intrinsic amorphous silicon 33 to absorb the environmental light, photoelectrons and electron holes are generated. P-type amorphous silicon 34 has extra electrons, which can increase the current in the photosensitive semiconductor layer 31. By using a three-layer structure of the N-type amorphous silicon 32, the intrinsic amorphous silicon 33, and the P-type amorphous silicon 34 in the photosensitive semiconductor layer, sensitivity of the photosensitive semiconductor layer 100 can be further improved.

In some embodiments, the photosensitive semiconductor layer 31 can only include the intrinsic amorphous silicon 33, or can includes a two-layer structure of the intrinsic amorphous silicon 33 and the P-type amorphous silicon 34.

As illustrated in FIG. 1, the array substrate 10 further includes the first insulation layer and the second insulation layer 19. The first insulation layer is disposed on the photosensitive semiconductor layer 31 and the thin film transistor 20. The second electrode plate 42 is disposed on the first insulation layer. The second insulation layer 19 is disposed on the second electrode plate 42. The first electrode plate 41 is disposed on the second insulation layer 19. The first electrode plate is connected to the photosensitive semiconductor layer through a first via hole 51 in the first insulation layer and the second insulation layer.

Specifically, the first insulation layer in FIG. 1 covers the insulation layer 17 and the planarization layer 18. In some situations, the array substrate can be disposed to cover only one of the cover insulation layer 17 and the planarization layer 18. At this time, the first insulation layer covers one of the cover insulation layer 17 and the planarization layer 18.

As illustrated in FIG. 1, the array substrate 10 further includes a connection electrode 43. The connection electrode 43 is disposed on the second insulation layer 19. The second insulation layer 19 includes a second via hole 52. The first insulation layer and the second insulation layer 19 includes a third via hole 53. An end of the connection electrode 43 is connected to the second electrode plate 42 through the second via hole 52. Another end of the connection electrode 43 is connected to the drain electrode 24 through the third via hole 53.

Specifically, the third via hole 53 in FIG. 1 further penetrates the protective insulation layer 16.

In one embodiment of the present application, the drain electrode 24 has one extension section 241. The photosensitive semiconductor layer 31 is disposed on the extension section 241 of the drain electrode 24. The extension section 241 of the drain electrode 24 acts as an electrode of one side of the photosensitive module 30 or is configured to transmit the electrical signal of the photosensitive semiconductor layer 31, which reduce a number of film layers of the photosensitive sensor, can reduce a number of manufacturing processes of the array substrate, and can save photomasks.

Furthermore, the first electrode plate 41 is electrically connected to a side of the photosensitive semiconductor layer 31 away from the extension section 241 of the drain electrode 24 through the first via hole 51. A part where the first electrode plate 41 is connected to the photosensitive semiconductor layer 31 (an extended part of the first via hole 51) acts as an electrode of other side of the photosensitive module 30 or is configured to transmit the electrical signal of the photosensitive semiconductor layer 31, which further reduce a number of film layers of the photosensitive sensor, can reduce a number of manufacturing processes of the array substrate, and can save photomasks.

Second Embodiment

Figure 2:
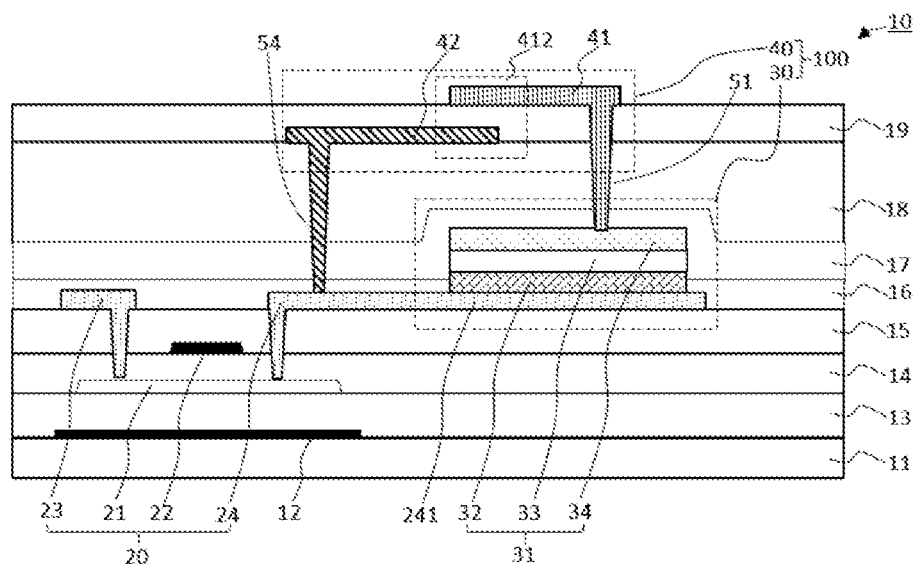
FIG. 2 is a second structural schematic diagram of the array substrate provided by one embodiment of the present application.

Please refer to FIG. 2. FIG. 2 is a schematic diagram of a second type of a structure of an array substrate provided by one embodiment of the present application. The array substrate 10 of the embodiment of the present application is same or similar to the first embodiment, and similarities are not described again. A difference is that a connection relation of the second electrode plate 42 and the drain electrode 24 is different.

The first insulation layer includes a fourth via hole 54. The second electrode plate 42 is connected to the drain electrode 24 through the fourth via hole 54.

Specifically, the first insulation layer in FIG. 2 covers the insulation layer 17 and the planarization layer 18. In some situations, the array substrate 10 can be disposed to cover only one of the cover insulation layer 17 or the planarization layer 18. At this time, the first insulation layer covers one of the cover insulation layer 17 or the planarization layer 18.

In the embodiment of the present application, there is no connection electrode 43 of the first embodiment, and the second electrode plate 42 is directly connected to the drain electrode 24 through the fourth via hole 54 in the first insulation layer.

It should be noted that the fourth via hole 54 in FIG. 2 further penetrate the protective insulation layer 16.

The embodiments of the present application have same beneficial effects as the first embodiment, and redundant description is not mentioned here again. Meanwhile, the connection electrode 43 is removed in the embodiment of the present application, which further simplifies a film structure of the array substrate, facilitates manufacturing and layout of the array substrate, and facilitates improvement of a yield rate.

Third Embodiment

Figure 3:
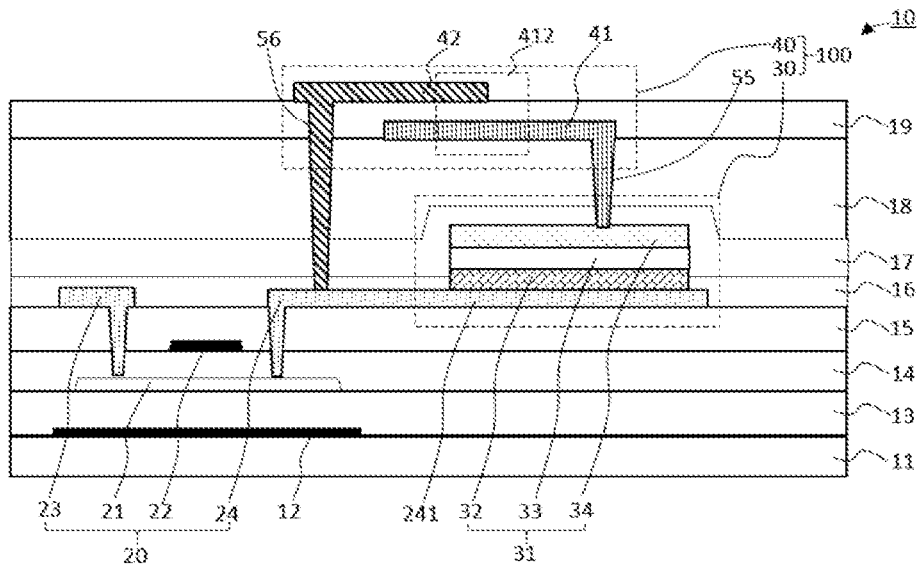
FIG. 3 is a third structural schematic diagram of the array substrate provided by one embodiment of the present application.

Please refer to FIG. 3. FIG. 3 is a third structural schematic diagram of the array substrate provided by one embodiment of the present application. The array substrate 10 of the embodiment of the present application is same or similar to the first embodiment and the second embodiment, and the similarities are not described again. A difference is that a positional relation of the first electrode plate 41 and the second electrode plate 42 is different.

In the embodiment of the present application, the first insulation layer is disposed on the photosensitive semiconductor layer 31 and the thin film transistor 20, and the first electrode plate 41 is disposed on the first insulation layer.

Specifically, the first insulation layer in FIG. 3 covers the insulation layer 17 and the planarization layer 18. In some situations, the array substrate can be disposed to cover only one of the cover insulation layer 17 or the planarization layer 18. At this time, the first insulation layer covers one of the cover insulation layer 17 or the planarization layer 18.

The second insulation layer 19 is disposed on the first electrode plate 41. The second electrode plate 42 is disposed on the second insulation layer 19. The first electrode plate 41 is connected to the photosensitive semiconductor layer 31 through a fifth via hole 55 in the first insulation layer. The second electrode plate 42 is connected to the drain electrode 24 through a sixth via hole 56 in the first insulation layer and the second insulation layer 19.

In the embodiment of the present application, the first electrode plate 41 is disposed on the first insulation layer, and the second electrode plate 42 is disposed on the second insulation layer 19. The embodiment of the present application further provides a structure of the array substrate 10 having a photosensitive sensor 100, which has same beneficial effects as the first embodiment and the second embodiment, and redundant description is not mentioned here again.

Fourth Embodiment

In any one of the array substrates 10 described in the first embodiment, the second embodiment, and the third embodiment, the array substrate 10 further includes a common electrode and a pixel electrode. Two situations of disposing the common electrode and the pixel electrode are described below.

In a first situation, the common electrode is disposed on the first insulation layer, and the pixel electrode is disposed on the second insulation layer. Wherein, the common electrode and a corresponding electrode plate on the first insulation layer are manufactured by a same metal, and the pixel electrode and a corresponding electrode plate on the second insulation layer 19 are manufactured by a same metal.

Specifically, in the first embodiment and the second embodiment, the second electrode plate 42 is disposed on the first insulation layer, the common electrode is disposed on the first insulation layer, and the common electrode and the second electrode plate 42 are manufactured by a same metal; and the first electrode plate 41 is disposed on the second insulation layer 19, the pixel electrode is disposed on the second insulation layer 19, and the pixel electrode and the first electrode plate 41 are manufactured by a same metal.

Specifically, in the third embodiment, the first electrode plate 41 is disposed on the first insulation layer, the common electrode is disposed on the first insulation layer, and the common electrode and the first electrode plate 41 are manufactured by a same metal, and the second electrode plate 42 is disposed on the second insulation layer 19, the pixel electrode is disposed on the second insulation layer 19, and the pixel electrode and the second electrode plate 42 are manufactured by a same metal.

In a second situation, the pixel electrode is disposed on the first insulation layer, and the common electrode is disposed on the second insulation layer 19. Wherein, the pixel electrode and the corresponding electrode plate on the first insulation layer are manufactured by a same metal, and the common electrode and the corresponding electrode plate on the second insulation layer 19 are manufactured by a same metal.

Specifically, in the first embodiment and the second embodiment, the second electrode plate 42 is disposed on the first insulation layer, the pixel electrode is disposed on the first insulation layer, and the pixel electrode and the second electrode plate 42 are manufactured by a same metal; and the first electrode plate 41 is disposed on the second insulation layer 19, the common electrode is disposed on the second insulation layer 19, and the common electrode and the first electrode plate 41 are manufactured by a same metal.

Specifically, in the third embodiment, the first electrode plate 41 is disposed on the first insulation layer, the pixel electrode is disposed on the first insulation layer, and the pixel electrode and the first electrode plate 41 are manufactured by a same metal; and the second electrode plate 42 is disposed on the second insulation layer 19, the common electrode is disposed on the second insulation layer 19, and the common electrode and the second electrode plate 42 are manufactured by a same metal.

It should be noted that, in some situations, and in any one of the aforesaid array substrate 10, an orthogonal projection of the first electrode plate 41 on the substrate 11 and an orthogonal projection of the semiconductor layer 31 on the substrate at least partially overlap with each other. At this time, a material of the first electrode plate 41 is a semi-transparent material or a transparent material, such as any one of indium tin oxide (ITO), indium zinc oxide (IZO), zinc oxide (ZnO), fluorine tin oxide (FTO), etc., so that the environmental light can pass through the first electrode plate 41 to reach the photosensitive semiconductor layer 31.

It should be noted that, in some embodiments, the first electrode plate 41 is electrically connected to the common electrode, i.e., the first electrode plate 41 provides an electrical signal through the common electrode.

In the array substrate of the embodiments of the present application, the common electrode and the corresponding electrode plate on the first insulation layer are manufactured by a same metal, the pixel electrode and the corresponding electrode plate on the second insulation layer 19 are manufactured by a same metal; or the pixel electrode and the corresponding electrode plate on the first insulation layer are manufactured by a same metal, and the common electrode and the corresponding electrode plate on the second insulation layer 19 are manufactured by a same metal. A number and complexity of the film layers of the array substrate 10 and the photosensitive sensor are allowed to be further reduced, the manufacturing processes of the array substrate 10 including the photosensitive sensor 100 can be decreased, and the photomasks can be reduced.

Fifth Embodiment

Figure 4:
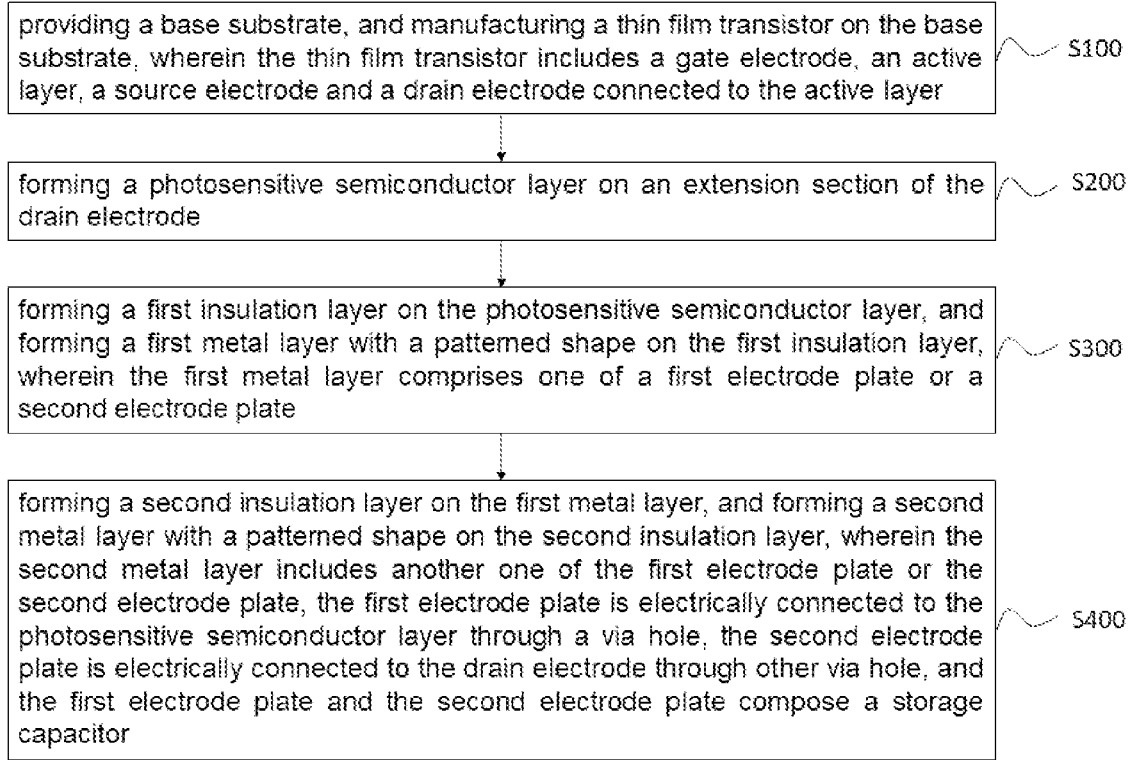
FIG. 4 is a schematic diagram of process steps of a manufacturing method of the array substrate provided by one embodiment of the present application.

Please refer to FIG. 4. FIG. 4 is a schematic diagram of process steps of a manufacturing method of the array substrate provided by one embodiment of the present application. The manufacturing method of the array substrate includes a step S100, a step S200, a step S300, and a step S400. FIG. 5 to FIG. 16 are schematic diagrams of manufacturing processes of the array substrate.

Step S100: providing a base substrate, and manufacturing a thin film transistor on the base substrate, wherein the thin film transistor includes a gate electrode, an active layer, a source electrode and a drain electrode connected to the active layer.

Figure 5:
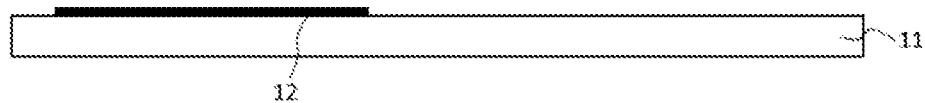
FIG. 5 to FIG. 16 are schematic diagrams of manufacturing processes of the array substrate provided by one embodiment of the present application.
Figure 6:
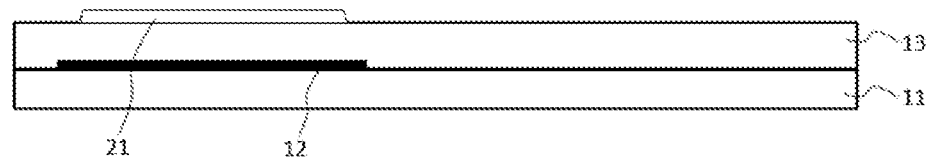
Figure 7:
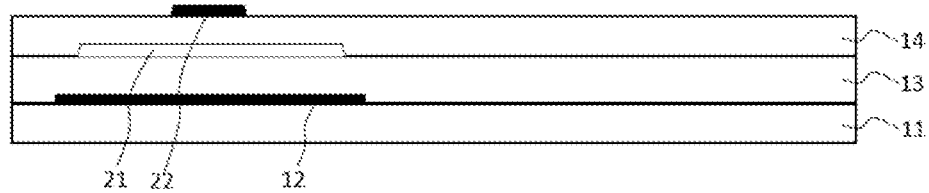
Figure 8:
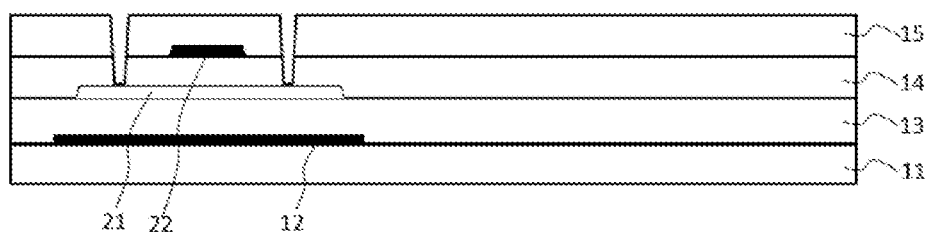
Figure 9:
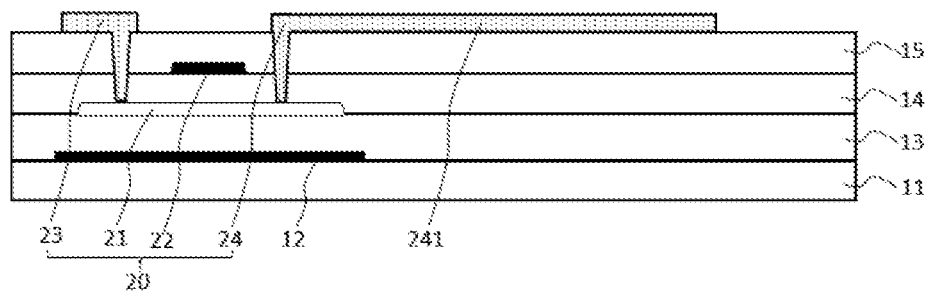

Specifically, please refer to FIG. 5 to FIG. 9. As illustrated in FIG. 5, a light shielding layer 12 is manufactured on the substrate 11, and a patterned light shielding layer 12 is formed by methods such as exposure, etching, etc. As illustrated in FIG. 6, a buffer layer 13 is manufactured on the light shielding layer 12, an active layer 21 is manufactured on the buffer layer 13, and a patterned active layer 21 is formed by methods such as exposure, etching, etc. A material of the active layer 21 can be polycrystalline silicon, amorphous silicon, a metal oxide semiconductor, etc. When the active layer 21 is the polycrystalline silicon, P-type ions can further be doped in the polycrystalline silicon to form N-type polycrystalline silicon, so that ohmic contact is easily formed on the active layer 21. As illustrated in FIG. 7, a gate insulation layer 14 is formed on the active layer 21, and a gate electrode 22 is formed on the gate insulation layer 14. As illustrated in FIG. 8, an interlayer insulation layer 15 is formed on the gate electrode 22, and the interlayer insulation layer 15 includes a via hole communicated with the active layer. As illustrated in FIG. 9, a source electrode 23, a drain electrode 24, and an extension section 241 of the drain electrode 24 are formed on the interlayer insulation layer 15, and the source electrode 23 and the drain electrode 24 are respectively connected to the active layer 21 through via holes in the interlayer insulation layer 15.

Step S200: forming a photosensitive semiconductor layer on the extension section of the drain electrode.

Figure 10:
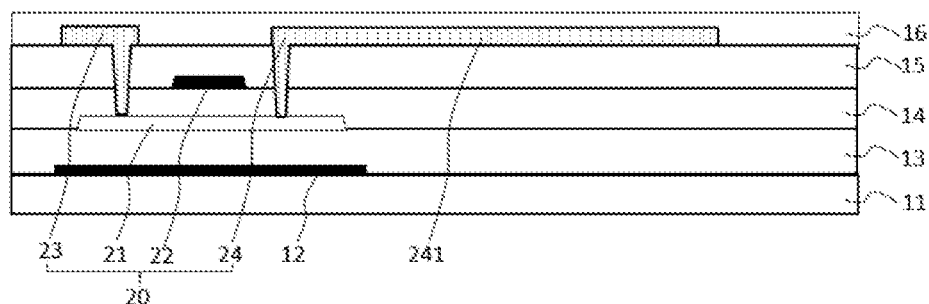
Figure 11:
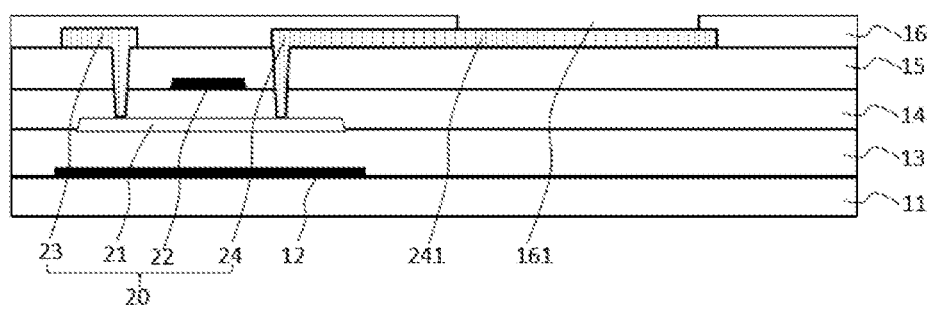
Figure 12:
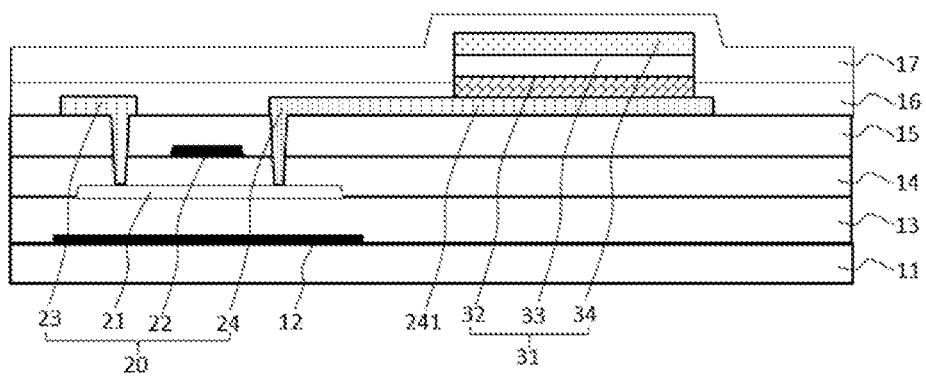

Specifically, please refer to FIG. 10 to FIG. 12. As illustrated in FIG. 10 and FIG. 11, a protective insulation layer 16 is formed on the source electrode 23, the drain electrode 24, and the extension section 241 of the drain electrode 24, and the protective insulation layer 16 has an opening 161 exposing the extension section 241 of the drain electrode 24. As illustrated in FIG. 12, the photosensitive semiconductor layer 31 is formed in the opening 161 on the extension section 241 of the drain electrode 24.

Specifically, in some embodiments, the photosensitive semiconductor layer 31 includes N-type amorphous silicon 32 disposed on the extension section 241 of the drain electrode 24 and intrinsic amorphous silicon 33 disposed on the N-type amorphous silicon 32.

Specifically, in some embodiments, the photosensitive semiconductor layer 31 includes the N-type amorphous silicon 32 disposed on the extension section 241 of the drain electrode 24, the intrinsic amorphous silicon 33 disposed on the N-type amorphous silicon 32, and P-type amorphous silicon 34 disposed on the intrinsic amorphous silicon 33.

Specifically, in some embodiments, the photosensitive semiconductor layer 31 can only include the intrinsic amorphous silicon 33, or can includes a two-layer structure of the intrinsic amorphous silicon 33 and the P-type amorphous silicon 34.

Step S300: forming a first insulation layer on the photosensitive semiconductor layer, and forming a first metal layer with a patterned shape on the first insulation layer, wherein the first metal layer includes one of a first electrode plate or a second electrode plate.

Figure 13:
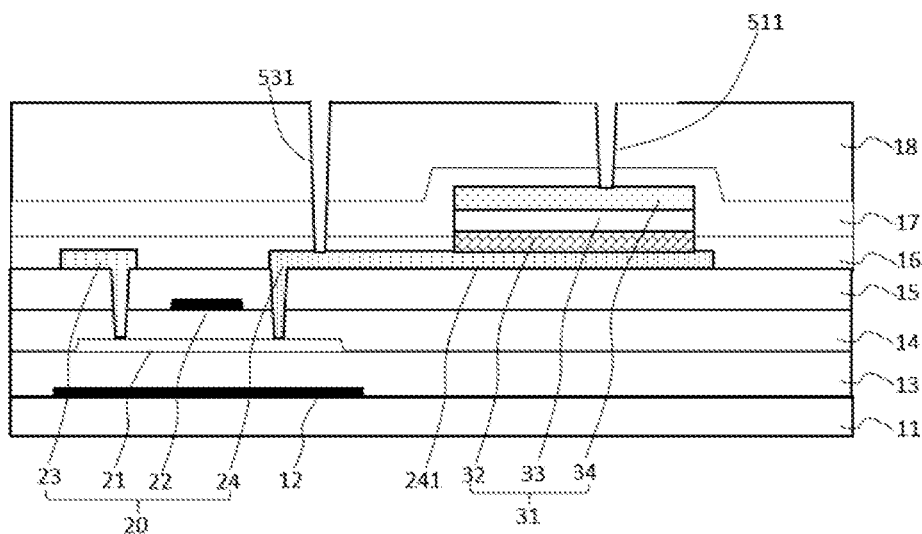
Figure 14:
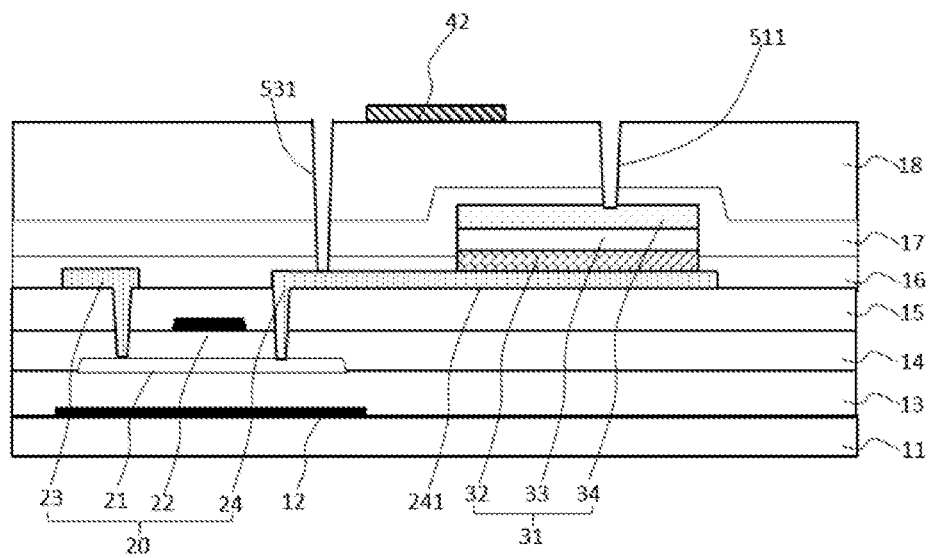

Specifically, as illustrated in FIG. 13, the first insulation layer is formed on the photosensitive semiconductor layer 31. The first insulation layer can include a cover insulation layer 17 disposed on the photosensitive semiconductor layer 31 and a planarization layer 18 disposed on the cover insulation layer 17. Wherein, only one of the cover insulation layer 17 or the planarization layer 18 can be disposed, or both of them can be disposed, and the cover insulation layer 17 and/or the planarization layer 18 is the first insulation layer. As illustrated in FIG. 14, the first metal layer is formed on the first insulation layer, the first metal layer has a patterned shape, and the first metal layer includes one of the first electrode plate 41 or the second electrode plate 42.

Specifically, as illustrated in FIG. 14, when the first insulation layer is manufactured, the first insulation layer includes a first preset via hole 511 and a second preset via hole 531, and the second preset via hole 531 further penetrate the protective insulation layer 16.

Step S400: forming a second insulation layer on the first metal layer, and forming a second metal layer with a patterned shape on the second insulation layer, wherein the second metal layer includes another one of the first electrode plate or the second electrode plate, the first electrode plate is electrically connected to the photosensitive semiconductor layer through a via hole, the second electrode plate is electrically connected to the drain electrode through another via hole, and the first electrode plate and the second electrode plate compose a storage capacitor.

Figure 15:
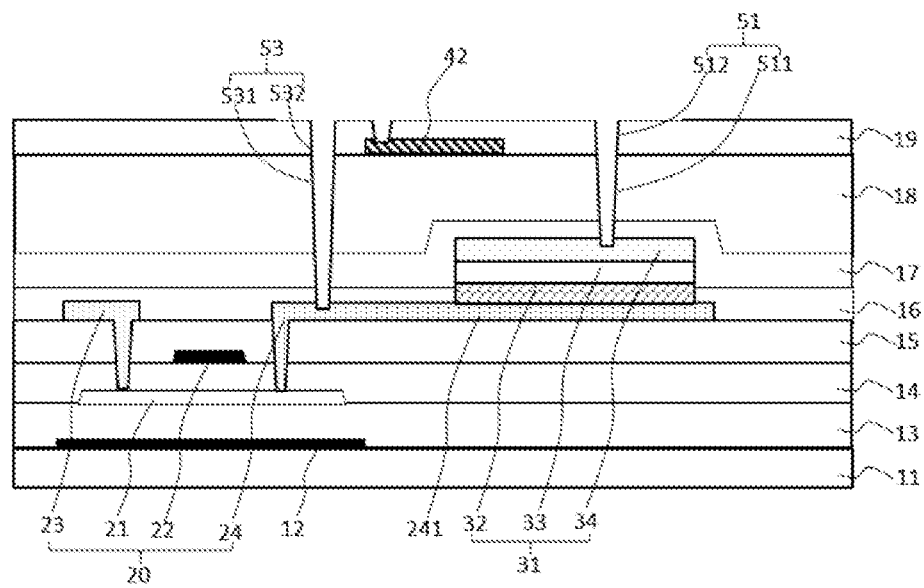
Figure 16:
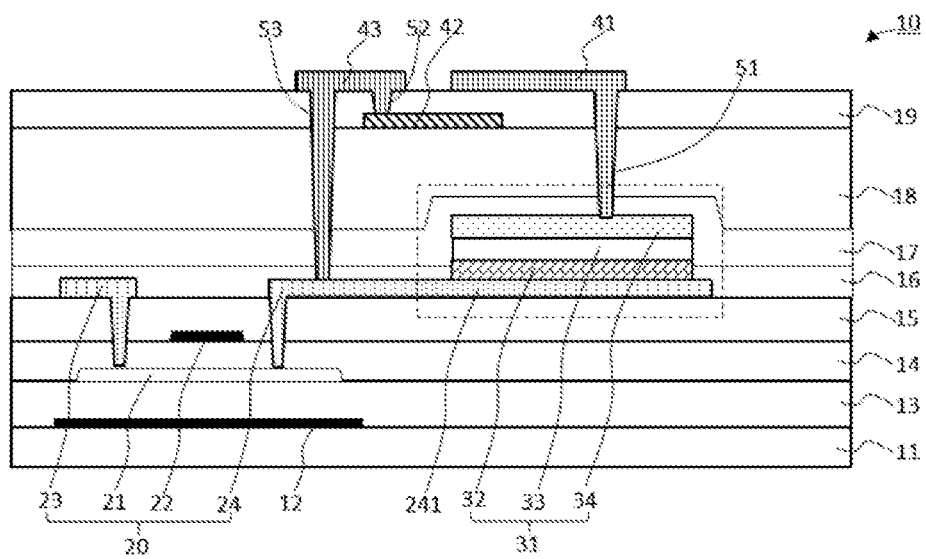

Specifically, as illustrated in FIG. 15, a second insulation layer 19 is formed on the first metal layer. As illustrated in FIG. 16, a patterned second metal layer is formed on the second insulation layer.

Specifically, the first metal layer includes one of the first electrode plate 41 or the second electrode plate 42. The second metal layer includes another one of the first electrode plate 41 and the second electrode plate 42, the first electrode plate 41 is electrically connected to the photosensitive semiconductor layer 31 through a via hole, the second electrode plate 42 is electrically connected to the drain electrode 24 through another via hole, and the first electrode plate 41 and the second electrode plate 42 compose a storage capacitor.

Specifically, as illustrated in FIG. 15, when the second insulation layer 19 is manufactured, the second insulation layer 19 includes a third preset via hole 512 and a fourth preset via hole 532, and the first preset via hole 511 and the third preset via hole 512 are coaxial and compose the first via hole 51 in aforesaid embodiments, and the second preset via hole 531 and the fourth preset via hole 532 are coaxial and compose the third via hole 53 in the aforesaid embodiments. The structure of the array substrate 10 in the first embodiment is taken as an example to illustrate the manufacturing processes of the array substrate 10 here.

It should be noted that the manufacturing method of the array substrate in the embodiments of the present application can be adopted to manufacture the array substrate in any one of the first embodiment, the second embodiment, the third embodiment, and the fourth embodiment. Please refer to the first embodiment, the second embodiment, the third embodiment, and the fourth embodiment for positional relation or connection relation of the first electrode plate 41 and the second electrode plate 42.

It should be noted that in some embodiments, the array substrate 10 further includes a common electrode and a pixel electrode. The two situations of disposing the common electrode and the pixel electrode are described below.

In a first situation, the common electrode is disposed on the first insulation layer, and the pixel electrode is disposed on the second insulation layer. Wherein, the common electrode and a corresponding electrode plate on the first insulation layer are manufactured by a same metal, and the pixel electrode and a corresponding electrode plate on the second insulation layer 19 are manufactured by a same metal.

In a second situation, the pixel electrode is disposed on the first insulation layer, and the common electrode is disposed on the second insulation layer 19. Wherein, the pixel electrode and a corresponding electrode plate on the first insulation layer are manufactured by a same metal, and the common electrode and a corresponding electrode plate on the second insulation layer 19 are manufactured by a same metal.

In one embodiment of the present application, please refer to FIG. 15 and FIG. 16. By taking a top-gate polycrystalline silicon thin film transistor as an example, the manufacturing processes of the array substrate 10 are described. In the array substrate 10 including the photosensitive sensor 100, 12 photomasks are included. Only two photomasks are added to the array substrate that does not include a photosensitive sensor, so the array substrate 10 including the photosensitive sensor 100 of the embodiments of the present application has simple processes and a small number of photomasks.

The array substrate 10 having the photosensitive sensor 100 is manufactured by adopting the manufacturing method of the array substrate of the embodiments of the present application. The drain electrode 24 has one extension section 241. The photosensitive semiconductor layer 31 is disposed on the extension section 241 of the drain electrode 24. The extension section 241 of the drain electrode 24 acts as an electrode of one side of the photosensitive module 30 or is configured to transmit the electrical signal of the photosensitive semiconductor layer 31, which reduce a number of film layers of the photosensitive sensor, can reduce a number of manufacturing processes of the array substrate, and can save a number of the photomasks.

Furthermore, in the array substrate of the embodiments of the present application, the common electrode and the corresponding electrode plate on the first insulation layer are manufactured by a same metal, the pixel electrode and the corresponding electrode plate on the second insulation layer 19 are manufactured by a same metal; or the pixel electrode and the corresponding electrode plate on the first insulation layer are manufactured by a same metal, and the common electrode and the corresponding electrode plate on the second insulation layer 19 are manufactured by a same metal. A number of the film layers of the array substrate 10 and the photosensitive sensor are allowed to be further decreased, the number of the manufacturing processes of the array substrate 10 including the photosensitive sensor 100 can be decreased, and the number of the photomasks can be reduced.

By adopting the manufacturing method of the array substrate of the embodiments of the present application to manufacture the array substrate 10 having the photosensitive sensor 100, an effect of simplifying the film layer can be obtained. The manufacturing method of the array substrate of the embodiments of the present application has effects of a small number of processes, simple processes, and saving the number of the photomasks.

Sixth Embodiment

Figure 17:
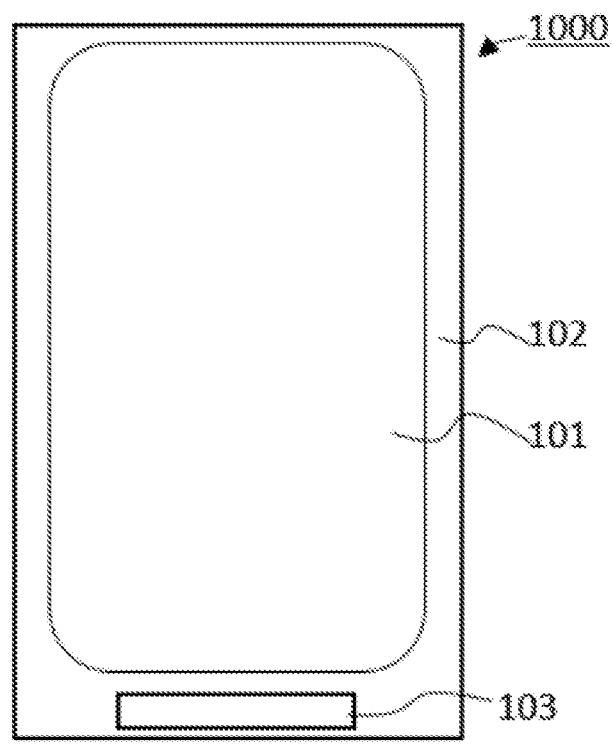
FIG. 17 is a schematic diagram of a display panel provided by one embodiment of the present application.

Please refer to FIG. 17. FIG. 17 is a schematic diagram of a display panel 1000 provided by one embodiment of the present application. The display panel 1000 includes any one of the array substrates 10 described in the aforesaid embodiments.

The display panel 1000 further includes a driving chip 103, or the display panel 1000 is electrically connected to the driving chip 103, and the second electrode plate is electrically connected to the driving chip through a wiring. In the aforesaid embodiment, the second electrode plate 42 of the array substrate 10 is electrically connected to the driving chip 103 through the wiring.

Working processes of the thin film transistor 20 and the photosensitive sensor 100 of the display panel 1000 is described as follow. In some embodiments, one of the first electrode plate 41 or the second electrode plate 42 is electrically connected to the driving chip 103, and another one of the first electrode plate 41 or the second electrode plate 42 provides an inherent signal.

Specifically, in some embodiments, the first electrode plate 41 is electrically connected to the common electrode of the array substrate or is supplied with a common electrode signal, the second electrode plate 42 is electrically connected to the driving chip 103 through a wiring, and which is taken as an example to describe the working processes of the thin film transistor 20 and the photosensitive sensor 100 of the display panel 1000 as follow. The thin film transistor 20 is turned on, a start signal is supplied to the second electrode plate 42, and then the thin film transistor 20 is turned off. One storage capacitor exists between the second electrode plate 42 and the first electrode plate 41. At this time, the second electrode plate 42 is in a floating state. The first electrode plate 41 is supplied with the common electrode signal, and the storage capacitor remains unchanged when there is no photocurrent in the photosensitive semiconductor layer 31. When environmental light is irradiated on the photosensitive semiconductor layer 31, the photocurrent is generated on the photosensitive semiconductor layer 31. Electric charges in the first electrode plate 41 and the second electrode plate 42 flow, resulting in changing of a size of the storage capacitor. The change of the size of the storage capacitor is transmitted to the driving chip 103 through the wiring connected to the second electrode plate 42. The driving chip 103 can determine whether conditions of the environmental light have been changed or how much the change is on the basis of amount of change in the capacitor. Then the driving chip 103 takes processing actions on the display panel 1000, such as adjusting a brightness of the display panel 1000. In a case of a high brightness of the environmental light, increasing the brightness of the display panel 1000 can facilitate users to better observe images.

As illustrated in FIG. 17, in some embodiments, the display panel 1000 includes a display region 101 and a non-display region 102, and the photosensitive sensor 100 can be disposed in the non-display region 102. In this way, the photosensitive sensor 100 does not affect arrangements of pixels in the display region 101, so that the photosensitive sensor 100 does not affect an aperture ratio of the pixels of the display panel 1000.

The array substrate, the manufacturing method of the array substrate, and the display panel provided by the embodiments of the present application are described in detail above. This article uses specific cases for describing the principles and the embodiments of the present application, and the description of the embodiments mentioned above is only for helping to understand the method and the core idea of the present application. Meanwhile, for those skilled in the art, will have various changes in specific embodiments and application scopes according to the idea of the present application. In summary, the content of the specification should not be understood as limit to the present application.

What is claimed is:

1. An array substrate, comprising:
a substrate;
a thin film transistor disposed on the substrate and comprising a gate electrode, an active layer, and a source electrode and a drain electrode connected to the active layer;
a photosensitive sensor, wherein the photosensitive sensor comprises a photosensitive module and a storage module, the photosensitive module comprises a photosensitive semiconductor layer, and the storage module comprises a first electrode plate and a second electrode plate; and
a first insulation layer disposed on the photosensitive semiconductor layer and the thin film transistor, wherein the storage module is disposed on the first insulation layer,
wherein the photosensitive semiconductor layer is disposed on an extension section of the drain electrode, the first electrode plate is electrically connected to a side of the photosensitive semiconductor layer away from the extension section of the drain electrode, and the second electrode plate is electrically connected to the drain electrode.

2. The array substrate as claimed in claim 1, wherein the storage module comprises a storage capacitor, and the first electrode plate and the second electrode plate compose the storage capacitor.

3. The array substrate as claimed in claim 2, wherein the second electrode plate is disposed on the first insulation layer, and the array substrate further comprises:
a second insulation layer disposed on the second electrode plate, wherein the first electrode plate is disposed on the second insulation layer, and the first electrode plate is connected to the photosensitive semiconductor layer through a first via hole in the first insulation layer and the second insulation layer.

4. The array substrate as claimed in claim 3, wherein the array substrate further comprises:
a connection electrode disposed on the second insulation layer, wherein the second insulation layer comprises a second via hole, the first insulation layer and the second insulation layer comprises a third via hole, an end of the connection electrode is connected to the second electrode plate through the second via hole, and another end of the connection electrode is connected to the drain electrode through the third via hole.

5. The array substrate as claimed in claim 3, wherein the first insulation layer comprises a fourth via hole, and the second electrode plate is connected to the drain electrode through the fourth via hole.

6. The array substrate as claimed in claim 2, wherein the first electrode plate is disposed on the first insulation layer, and the array substrate further comprises:
a second insulation layer disposed on the first electrode plate, wherein the second electrode plate is disposed on the second insulation layer, the first electrode plate is connected to the photosensitive semiconductor layer through a fifth via hole in the first insulation layer, and the second electrode plate is connected to the drain electrode through a sixth via hole in the first insulation layer and the second insulation layer.

7. The array substrate as claimed in claim 3, wherein the photosensitive semiconductor layer is made of amorphous silicon.

8. The array substrate as claimed in claim 7, wherein the photosensitive semiconductor layer comprises N-type amorphous silicon disposed on the extension section of the drain electrode and intrinsic amorphous silicon disposed on the N-type amorphous silicon, or
the photosensitive semiconductor layer comprises the N-type amorphous silicon disposed on the extension section of the drain electrode, the intrinsic amorphous silicon disposed on the N-type amorphous silicon, and P-type amorphous silicon disposed on the intrinsic amorphous silicon.

9. The array substrate as claimed in claim 7, wherein the array substrate further comprises:
a common electrode disposed on the first insulation layer; and
a pixel electrode disposed on the second insulation layer;
wherein the common electrode and a corresponding electrode plate on the first insulation layer are manufactured by a same metal, and the pixel electrode and a corresponding electrode plate on the second insulation layer are manufactured by a same metal.

10. The array substrate as claimed in claim 7, wherein the array substrate further comprises:
a pixel electrode, disposed on the first insulation layer; and
a common electrode disposed on the second insulation layer;
wherein the pixel electrode and a corresponding electrode on the first insulation layer are manufactured by a same metal, and the common electrode and a corresponding electrode plate on the second insulation layer are manufactured by a same metal.

11. The array substrate as claimed in claim 7, wherein an orthogonal projection of the first electrode plate on the substrate and an orthogonal projection of the photosensitive semiconductor layer on the substrate at least partially overlap with each other, and a material of the first electrode plate is a transparent material.

12. The array substrate as claimed in claim 9, wherein the first electrode plate is electrically connected to the common electrode.

13. A manufacturing method of an array substrate, comprising following manufacturing steps:

providing a base substrate, and manufacturing a thin film transistor on the base substrate, wherein the thin film transistor comprises a gate electrode, an active layer, a source electrode and a drain electrode connected to the active layer;

forming a photosensitive semiconductor layer on an extension section of the drain electrode;

forming a first insulation layer on the photosensitive semiconductor layer and thin film transistor, and forming a first metal layer with a patterned shape on the first insulation layer, wherein the first metal layer comprises one of a first electrode plate or a second electrode plate; and forming a second insulation layer on the first metal layer, and forming a second metal layer with a patterned shape on the second insulation layer, wherein the second metal layer comprises another one of the first electrode plate or the second electrode plate, the first electrode plate is electrically connected to the photosensitive semiconductor layer through a via hole, the second electrode plate is electrically connected to the drain electrode through another via hole, and the first electrode plate and the second electrode plate compose a storage capacitor;

wherein the storage capacitor is disposed on the first insulation layer.

14. A display panel, comprising an array substrate, wherein the array substrate comprises:

a substrate;

a thin film transistor disposed on the substrate and comprising a gate electrode, an active layer, and a source electrode and a drain electrode connected to the active layer;

a photosensitive sensor, wherein the photosensitive sensor comprises a photosensitive module and a storage module, the photosensitive module comprises a photosensitive semiconductor layer, and the storage module comprises a first electrode plate and a second electrode plate; and a first insulation layer disposed on the photosensitive semiconductor layer and the thin film transistor, wherein the storage module is disposed on the first insulation layer, wherein the photosensitive semiconductor layer is disposed on an extension section of the drain electrode, the first electrode plate is electrically connected to a side of the photosensitive semiconductor layer away from the extension section of the drain electrode, and the second electrode plate is electrically connected to the drain electrode.

15. The display panel as claimed in claim 14, wherein the storage module comprises a storage capacitor, and the first electrode plate and the second electrode plate compose the storage capacitor.

16. The display panel as claimed in claim 15, wherein the second electrode plate is disposed on the first insulation layer, and the array substrate further comprises:

a second insulation layer disposed on the second electrode plate, wherein the first electrode plate is disposed on the second insulation layer, and the first electrode plate is connected to the photosensitive semiconductor layer through a first via hole in the first insulation layer and the second insulation layer.

17. The display panel as claimed in claim 16, wherein the array substrate further comprises:

a connection electrode disposed on the second insulation layer, wherein the second insulation layer comprises a second via hole, the first insulation layer and the second insulation layer comprises a third via hole, an end of the connection electrode is connected to the second electrode plate through the second via hole, and another end of the connection electrode is connected to the drain electrode through the third via hole.

18. The display panel as claimed in claim 16, wherein the array substrate further comprises:

the first insulation layer comprising a fourth via hole, wherein the second electrode plate is connected to the drain electrode through the fourth via hole.

19. The display panel as claimed in claim 15, wherein the first electrode plate is disposed on the first insulation layer, and the array substrate further comprises:

a second insulation layer disposed on the first electrode plate, wherein the second electrode plate is disposed on the second insulation layer, the first electrode plate is connected to the photosensitive semiconductor layer through a fifth via hole in the first insulation layer, and the second electrode plate is connected to the drain electrode through a sixth via hole in the first insulation layer and the second insulation layer.

20. The display panel as claimed in claim 14, wherein the display panel further comprises a driving chip, and the second electrode plate is electrically connected to the driving chip through a wiring.

* * * * *